United States Patent [19]
Goetting

[11] Patent Number: 4,866,432
[45] Date of Patent: Sep. 12, 1989

[54] FIELD PROGRAMMABLE MATRIX CIRCUIT FOR EEPROM LOGIC CELLS

[75] Inventor: Erich Goetting, Cupertino, Calif.

[73] Assignee: Exel Microelectronics, Inc., San Jose, Calif.

[21] Appl. No.: 198,952

[22] Filed: May 26, 1988

Related U.S. Application Data

[63] Continuation-in-part of Ser. No. 856,623, Apr. 25, 1986, abandoned.

[51] Int. Cl.$^4$ .......................... H04Q 3/00; G06F 7/38
[52] U.S. Cl. .......................... 340/825.84; 340/825.83; 340/825.85; 340/825.89; 307/465
[58] Field of Search ................ 340/825.83, 825.84, 340/825.85, 825.86, 825.89, 825.9, 825.91; 307/465, 466; 364/716

[56] References Cited

U.S. PATENT DOCUMENTS 3,720,925  3/1973  Ross ................ 340/825.86
4,495,590  1/1985  Mitchell, Jr. ................ 307/465
4,670,749  6/1987  Freeman ................ 340/825.85

Primary Examiner—Robert L. Griffin
Assistant Examiner—Ralph E. Smith
Attorney, Agent, or Firm—Townsend and Townsend

[57] ABSTRACT

An improved field programmable matrix circuit. The matrix circuit includes a plurality of pairs of input lines having noninverted and inverted inputs. These input lines intersect a plurality of output column lines. A single transistor is used to provide a programmable connection to each column line from both the inverted and noninverted inputs of an input line pair. The transistor has a source, a drain and a gate with either the source or the drain coupled to a voltage potential and the other of the source or the drain coupled to an output column line. The gate is alternately coupled to a noninverted input, an inverted output, or a second voltage potential. The second voltage potential is coupled when it is desired to hold the transistor in an off state.

3 Claims, 3 Drawing Sheets

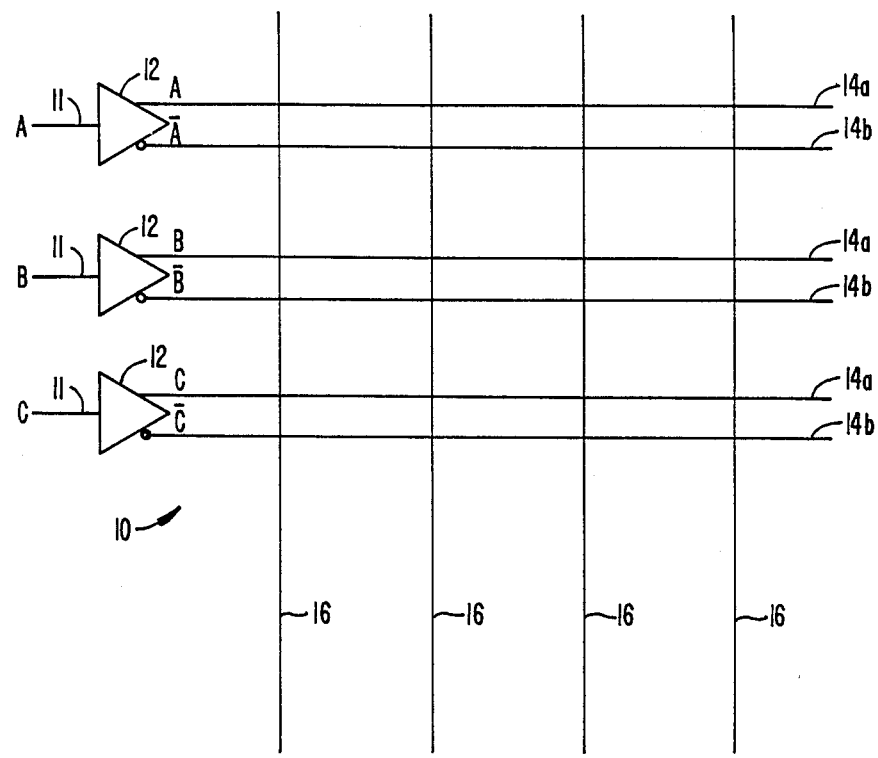
FIG._1.
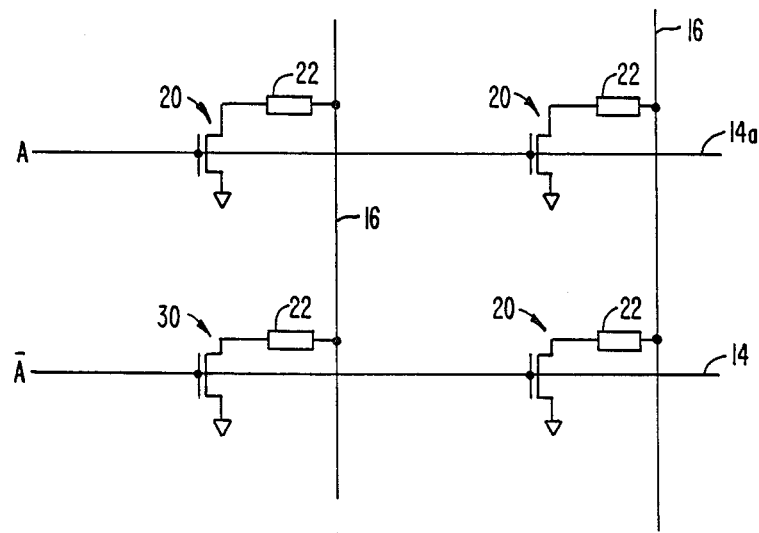
FIG._2.
PRIOR ART

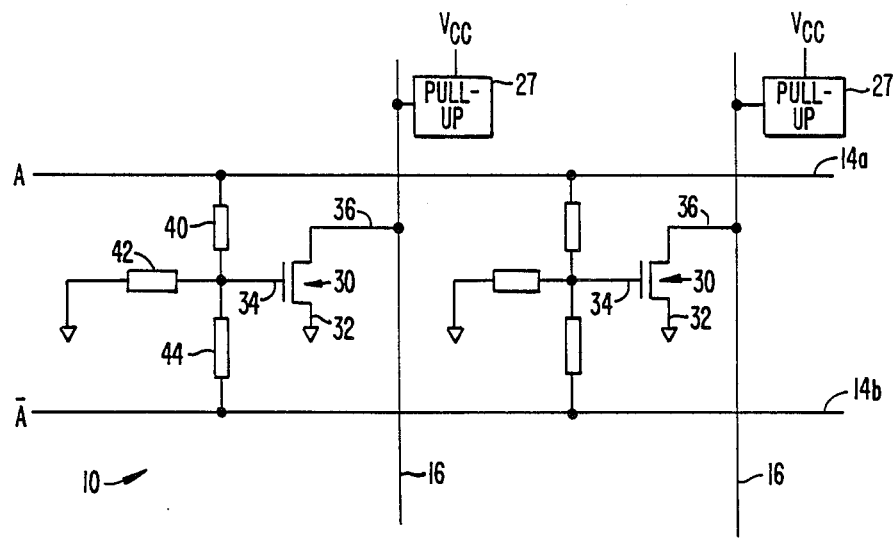
FIG._3.
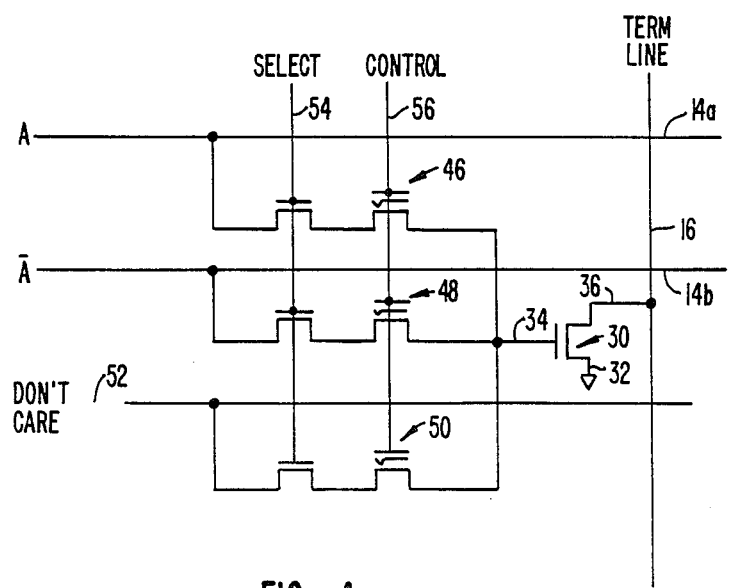
FIG._4.

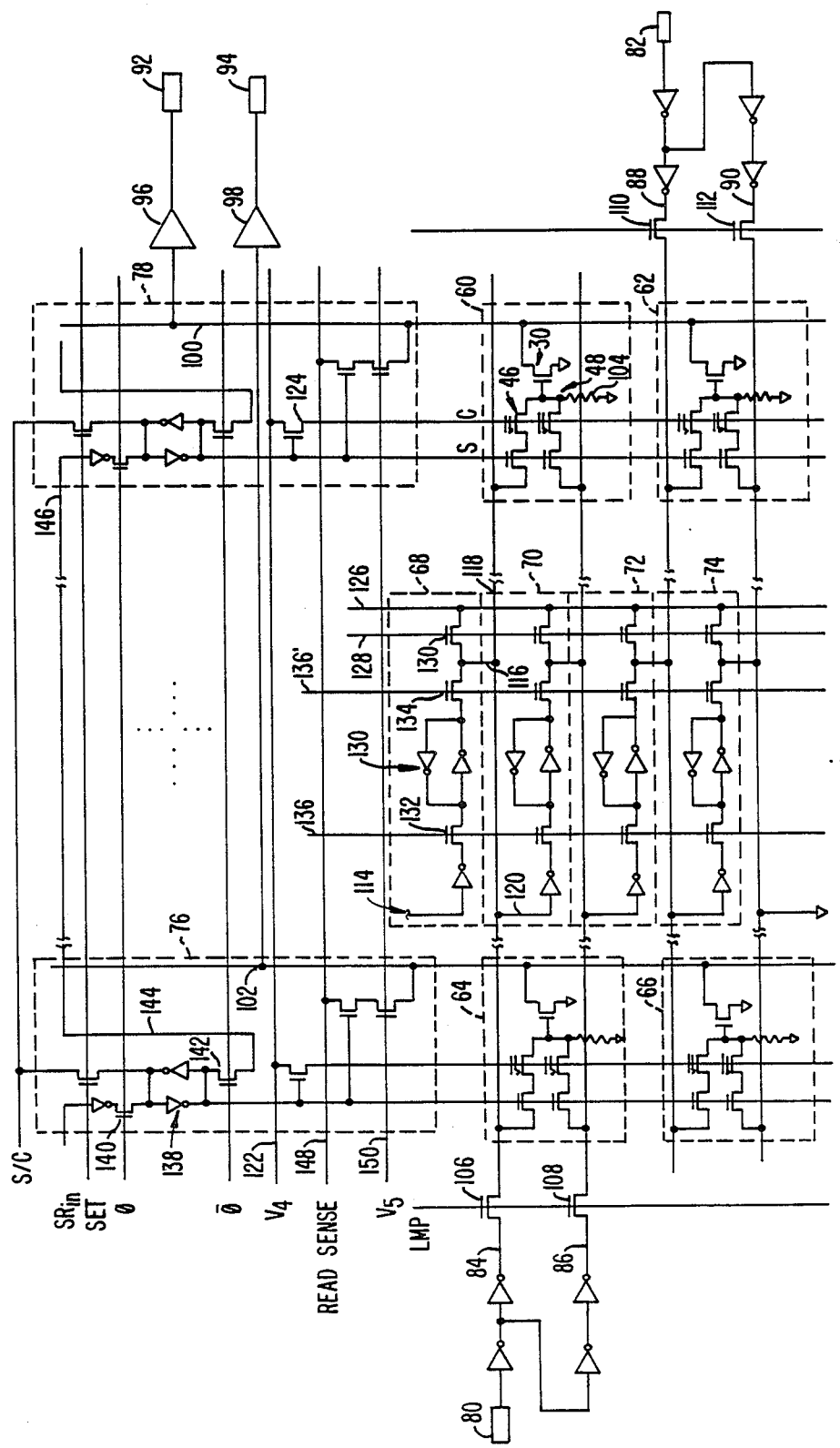
FIG._5.

FIELD PROGRAMMABLE MATRIX CIRCUIT FOR EEPROM LOGIC CELLS

This is a continuation-in-part of application Ser. No. 856,623 filed Apr. 25, 1986, now abandoned.

BACKGROUND

The present invention relates to field programmable matrix circuits which have a plurality of noninverted and inverted input lines which can be programmably coupled to a plurality of column lines.

Programmable matrix circuits are well known in the art. A typical programmable matrix circuit has a plurality of row lines, each of which can be coupled to one or more of a plurality of column lines. Typically, programmable matrix circuits are used in a logic array or in a memory. In a logic array, the inputs are provided in pairs, with a noninverted and an inverted input for each pair. Memory circuits do not have this pairing characteristic.

In a typical logic array, a single column is used as the output of a logic gate, such as a NOR gate, and is referred to as a term line. The inputs which are coupled to that column provide the inputs to the logic gate. The particular inputs which are coupled to a column (term) can be programmed by selecting the desired inputs to be coupled to that column. An example of the use of a programmable matrix circuit in a programmable logic array is shown in U.S. Pat. No. 4,124,899.

In the prior art, the programmability of the matrix circuit is accomplished by using a transistor to provide a coupling link between each and every row line and each and every column line. If it is desired to affect the state of a column with a particular row, then the transistor at the row-column intersection is enabled. Conversely, if a particular row is not to affect the state of a column, the transistor is disabled. The enablement or disablement of the transistor can be accomplished in a number of ways, and can be accomplished in the factory or in the field by the customer. In the factory, to disable a transistor, it could, for instance, be left out entirely during the fabrication process or any one of certain structures which comprise the transistor can be omitted during the fabrication process. In this way, an operational transistor is not created and the transistor's operation is in effect disabled. The transistor can also be enabled by providing a metal connection to the column during the metal masking step. U.S. Pat. No. 4,495,590 to Mitchell, Jr. shows a matrix in which a transistor has its gate terminal selectively coupled to one of true and complement lines or unconnected, presumably at the metal mask stage of production.

Alternatively, the transistor can be enabled or disabled in the field by a customer. For instance, an operational transistor can be connected to the column via a fusible link which may be made nonconductive by blowing the fuse. Alternately, all the transistors can be operationally connected and can be selectively enabled or disabled by a charged storage mechanism such as those used in EPROM (Electrically Programmable Read Only Memory) or EEPROM (Electrically Erasable Programmable Read Only Memory) technology.

For the field programmable devices, there is always a single transistor per input line for each column line. The disadvantage of this prior art technique is that for many logic applications there results an excessive logic propagation delay. The propagation delay is dependent upon the rate at which the column changes voltage levels following an input transition. The change in voltage per unit time, or slew rate, of the column following activation or deactivation of a transistor is proportional to the ratio of the conductance of the transistor to the total column capacitance. The column capacitance is in turn dependent upon the capacitance of each transistor coupled to the column and thus the number of pull-down transistors on the column. In the field, unlike in the factory, it is not possible to simply leave out the unused transistors or leave out their metal connections.

SUMMARY OF THE INVENTION

The present invention is an improved field programmable matrix circuit. The matrix circuit includes a plurality of pairs of input lines having noninverted and inverted inputs. These input lines intersect a plurality of output column lines. A single transistor is used to provide a programmable connection to each column line from both the inverted and noninverted inputs of an input line pair. The transistor has a source, a drain and a gate with either the source or the drain coupled to a voltage potential and the other of the source or the drain coupled to an output column line. The gate is alternately coupled to a noninverted input, an inverted input, or the voltage potential.

The present invention thus removes the multiple memory transistors one stage from the column line, using a single transistor coupled to the column line. In addition to memory transistor connections to true and complement inputs, a third connection provides both a path for the programming current in the programming mode and a voltage to force the single transistor off in the logic mode when neither the true nor complement inputs are enabled.

By coupling the gate to a voltage potential to turn the transistor off ($V_{GS}$ < threshold voltage, $V_T$, typically 1 volt), the transistor will have no effect on the column line, allowing the column line to be pulled up unless another transistor is pulling it down. The coupling of the gate of the transistor to the voltage potential or the noninverted or inverted inputs is preferably done using a EEPROM transistor cell which enables the use of a low voltage, high performance transistor for the coupling connection to the column line. A high voltage EEPROM transistor is then used in series with the gate of the low voltage coupling transistor. By using a single transistor coupled to the column line rather than the two transistors of the prior art, the capacitance coupled to the column line is cut in half, thus decreasing propagation delay by a factor of 2. The low voltage transistor provides a further reduction in propagation delay by a factor of 15 due to the high performance characteristics of the transistor, thus giving a total increase in performance of $2 \times 15 = 30$.

A pair of shift registers cross through the center of the array to provide the programming inputs to the selected cells.

BRIEF OF THE DRAWINGS

FIG. 1 is a schematic illustration of an unprogrammed matrix circuit;

FIG. 2 is a schematic diagram of a portion of a prior art matrix circuit using a transistor for each row-column intersection;

FIG. 3 is a diagram of a single transistor connection according to the present invention;

FIG. 4 is a schematic diagram of the single transistor connection of FIG. 3 programmed utilizing EEPROM transistors; and FIG. 5 is a schematic diagram showing the programming architecture for the present invention.

DETAILED DESCRIPTION OF THE PREFERRED EMBODIMENTS

Referring to FIG. 1, there is shown a programmable matrix circuit of the type used in the prior art and the present invention. Matrix circuit 10 includes a plurality of input signals 11 (shown as A, B, C). Each of input signals 11 is connected to an input driver 12. From each driver 12 a pair of input lines, an input line 14a and an inverted input line 14b, are provided. An input signal is supplied on input line 14a and an inverted input signal is supplied on inverted input line 14b. Matrix circuit 10 has a plurality of pairs of input lines 14a and 14b.

The plurality of pairs of input lines 14a and 14b intersect a plurality of column lines 16. Each of input lines 14a and 14b can be programmably coupled to each column line 16. Each column line 16 can be used as a logic date, such as a NOR gate. Each input line coupled to a column 16 will be an input to the logic gate.

Referring to FIG. 2, there is shown one embodiment of a field programmable connection used in the prior art. A programmable transistor 20 is provided at each intersection of an input line 14a or 14b with a column 16. The programmable transistor 20 shown is of the MOS N-channel type having a source connected to ground potential, a gate connected to the input line 14, and a drain connected through a connection means 22 to a column 16. In the prior art, the connection means 22 is typically a fuse or a transistor connection.

Referring to FIG. 3, there is shown a matrix circuit according to the present invention. A single transistor 30 is used to couple one or the other of row lines 14a and 14b to a particular column 16. Each transistor 30 is of the MOS N-channel type having a drain 36 connected to a column line 16, a source 32 coupled to ground and a gate S4. Source 32 can alternately be coupled to any potential which is lower than the potential of column line 16. Coupling means 40, 42 and 44 are provided to connect the gate 34 of transistor 30 to either input line 14a, ground potential, or input line 14b, respectively. Again, the ground potential which coupling means 42 connects to could be some other potential so long as the potential from gate 34 to source 32 is ($V_{GS}$) low enough to turn off transistor 30 (typically, less than 1 volt).

Transistor 30 has three allowable logic states. In the first logic state, if the gate of transistor 30, which is node 34, is coupled to input line 14a, node 34 will assume the state of the input signal. Transistor 30 will be activated when its gate, node 34, is greater than $V_T$. In the second logic state. if node 34 is coupled to input line 14b it will assume the state of the inverted input signal. Third, if node 34 is coupled to ground potential, transistor 30 is turned off so that it cannot pull down column line 16. In the absence of another transistor pulling down column line 16, a pull-up element 27 will cause column line 16 to assume a logic high state.

FIG. 4 shows an embodiment of the present invention in which EEPROM transistor cells 46, 48 and 50 are used to provide a connection between gate 34 of transistor 30 and either noninverted input line 14a, inverted input line 14b, or a "don't care" line 52 which is typically connected to a low voltage or ground potential.

Each transistor can be programmed through the use of a select line 54 and a control line 56 in the standard manner. A transistor is programmed by placing electrical charge on the floating gate of the EEPROM transistor sufficient to prevent it from conducting with the potential applied to control line 56. When the EEPROM transistor does not conduct, there is no effective connection between gate 34 and the line to which the EEPROM transistor is providing a coupling connection. Thus, in FIG. 4, if it was desirable to connect gate 34 to noninverted input line 14a, a negative electrical charge would be placed on the gates of EEPROM transistors 48 and 50 while negative electrical charges would be removed from transistor 46. The use of EEPROM transistors enables the programming to be altered at any time.

Alternately, transistor 50 could be a high value resistance. This resistance will hold node 34 to a value less than $V_T$ in the absence of a connection to lines 14a or 14b, and thus prevents column line 16 from coupling in to turn on transistor 30. The resistive value is high enough so that little current is drawn when either of elements 40 or 44 is used to connect lines 14a or 14b.

The present invention thus provides an advantage over the prior art circuit by replacing two transistors with a single transistor. While it is true that during the operation of the matrix circuit of the prior art, only one of the transistors in the pair is activated, nevertheless, two transistors must be provided as a part of the matrix circuit to programmably interconnect a pair of input lines with each column line. In contrast, the matrix circuit of the present invention uses only one transistor for each pair of input lines per intersection with a column line. In MOS technology, this single transistor can be made with a channel width that is twice that of each of the two transistors utilized in the prior art. This results in increased conductivity without a corresponding increase in capacitance. Conversely, this single transistor can be made with a channel width equal to that of the prior art, but with approximately one-half the capacitance. Thus, the matrix circuit of the present invention provides an increased switching speed for logic gates. Similar benefits result in bipolar technology.

FIG. 5 is a schematic diagram showing the programming circuitry for a plurality of cells of FIG. 4. Four cells 60, 62, 64 and 66 are shown out of an array of such cells. This array of cells covers the interior of a semiconductor chip. Down the center of the array, a column of shift register stages 68, 70, 72, and 74 are shown. Additional shift register stages connect to the remaining cells not shown. Similarly, a row of shift register stages extends horizontally to the middle of the chip, of which two such shift register stages 76 and 78 are shown.

Two inputs, 80 and 82, to the chip are shown. Input 80 produces a true input 84 and a complementary input 86. Similarly, input 82 provides a true input 88 and a complementary input 90. Two outputs are shown as outputs 92 and 94 from sense amplifiers 96 and 98, respectively. The sense amplifiers are coupled to column lines 100 and 102, respectively.

Referring to cell 60, it has transistors 46 and 48 coupling the gate of transistor 30 to the true and complementary inputs in the manner shown in FIG. 4. Instead of a third transistor 50, a resistor 104 is provided to give the don't care connection to ground. Resistor 104 preferably has a value in the range of 1-10 mega ohms. Transistor 30 is coupled to column line 100, similarly to the manner shown in FIG. 4. Similar connections are shown for cells 62, 64 and 66.

During programming of the array of cells, transistors 106 and 108 isolate true and complementary inputs 84 and 86, while transistors 110 and 112 isolate true and complementary inputs 88 and 90, respectively.

For programming, a stream of input numbers are shifted from an input terminal 114 to shift register stage 68 to the remaining shift register stages. The output of shift register stage 68 is on a line 116 coupled to a word line 118. This forms the input on a line 120 to shift register stage 70. If a column of cells including cells 60 and 62 is to be programmed, a value of one is stored in shift register stage 78 and appropriate values are shifted into shift register stages 68 through 74. These value will select either the true or complement line or neither for each of the cells in that column. The nonselected columns will have a zero in their shift register stage, such as shift register stage 76. To program, if a transistor 46 of cell 60, for instance, is to be set, a high voltage is applied on control line 122 which is provided to the gate of transistor 46 by a transistor 124, which has its gate enabled by a voltage value provided to its gate. Resistor 104 provides the path to ground necessary for electrons to be removed from the floating gate of transistor 46, thereby programming it.

Prior to such programming, all of the cells must be erased. This is provided by grounding a line 126 provided to shift register stages 68 through 74 and providing an enabling voltage on line 128 to transistor 130 of shift register stage 68 and corresponding transistors of the remaining shift register stages. This connects the appropriate true or complement line to ground through transistor 138 or its corresponding element in the remaining shift register stages. During programming, line 128 is brought low to disconnect this connection to ground.

As can be seen, each shift register stage has the same structure. Shift register stage 68 has a latch 130 at its center composed of a pair of inverters. The input and output of the latch are isolated from the other circuitry by transistors 132 and 134, respectively. A control line 136 is coupled to the gate of transistor 132, while the complement value provided on control line 136 is provided on a control line 136' coupled to the gate of transistor 134. Thus, as the control signal is alternated, either the input or the output of the latch it enabled, providing the shift register stage function.

As can be seen, shift register stages 76 and 78 are constructed similarly, with shift register stage 78 having a latch 138 and input and output transistors 140 and 142 having their gates coupled to the true and complement values of a control signal. The output of shift register stage 76 is provided on a line 144 to a next shift register stage which is alternated, provided through a series of shift register stages to an input 146 of shift register stage 78.

As can be seen, to enable succeeding columns, a value of one can simply be shifted across the row of shift register stages including shift register stages 76 and 78. At the same time, each column is input with data for the cells in that column through input 114. After a particular column has been enabled and the appropriate values have been fed into stages 68-74 of the vertical shift register stage, along with the corresponding stages not shown, the selected column can be programmed by applying the high voltage on input 122.

After programming has been completed, the output values can be read on a read sense line 148 by selecting the appropriate cells and providing the read signal on input 150.

After programming and verification with the read sense line, the programming and read sense circuits are isolated and the chip can be used as logic which will perform selected operations on inputs on lines 80 and 82 as dictated by the states of the various cells, with the outputs being provided on lines 92 and 94.

As will be understood by those familiar with the art, the present invention may be embodied in other specific forms without departing from the spirit or essential characteristic thereof. For example, the source of the nMOS transistor shown could be coupled to a voltage potential other than ground or a pMOS transistor could be used. Accordingly, the disclosure of the preferred embodiments of the present invention is intended to be illustrative, but not limiting, of the scope of the invention, which is set forth in the following claims.

What is claimed is:

1. A field programmable matrix circuit comprising:
   a plurality of pairs of input lines, each pair of lines providing an input signal on a first line and the inverse of the input signal on a second line;
   a plurality of output lines;
   a plurality of programmable transistors, each programmable transistor having a source, a drain and a gate, one of said source and said drain being coupled to a first voltage potential and the other of said source and said drain being coupled to one of said output lines;
   a plurality of activating circuits for selectively coupling the gate of each of said programmable transistors to one line of a pair of said input lines or a second voltage potential, each activating circuit including
   a first EEPROM transistor cell coupled between said gate of said programmable transistor and a first, true line of one of said input pairs, and
   a second EEPROM transistor cell coupled between said gate of said programmable transistor and a second, complement line of said one of said input pairs, and
   hold off means, coupled between said gate of said programmable transistor and a second voltage potential, for coupling said gate to said second voltage potential when neither of first and second EEPROM transistor cells are activated and for providing a current path to said second voltage potential from said EEPROM cells during a programming of said EEPROM cells; and
   means for programming said EEPROM cells by the application of appropriate voltage signals;
   wherein each of said EEPROM cells comprises an EEPROM transistor coupled to said gate of said programmable transistor and an MOS transistor coupled between said EEPROM transistor and one of said pair of input lines.

2. The matrix of claim 1 wherein said means for programming includes:
   a first shift register having a plurality of stages, each stage being coupled to one of said input lines.
   a second shift register having a plurality of stages, each stage being coupled to a gate of each said MOS transistor in a column of said EEPROM cells for activating said connection between said EEPROM cells and said input lines; and a programming input line coupled to a gate of each EEPROM transistor in said column of EEPROM cells for providing a programming input to said EEPROM transistors.

3. A field programmable matrix circuit comprising:
a plurality of pairs of input lines, each pair of lines providing an input signal on a first line and the inverse of the input signal on a second line;
a plurality of output lines;
a plurality of programmable transistors, each programmable transistor having a source, a drain and a gate, one of said source and said drain being coupled to a first voltage potential and the other of said source and said drain being coupled to one of said output lines;
a plurality of activating circuits for selectively coupling the gate of each of said programmable transistors to one line of a pair of said input lines or a second voltage potential, each activating circuit including
- a first EEPROM transistor coupled to said gate of said programmable transistor and a first MOS transistor coupling said first EEPROM transistor to a first, true line of one of said input pairs,
- a second EEPROM transistor coupled between said gate of said programmable transistor and a second MOS transistor coupling said second EEPROM transistor to a second, complement line of said one of said input pairs, and
- hold off means, coupled between said gate of said programmable transistor and a second voltage potential, for coupling said gate to said second voltage potential when neither of first and second EEPROM transistors are activated and for providing a current path to said second voltage potential from said EEPROM cells during a programming of said EEPROM cells; and means for programming said EEPROM cells by the application of appropriate voltage signals, said means for programming including
- a first shift register having a plurality of stages, each stage being coupled to one of said input lines,
- a second shift register having a plurality of stages, each stage being coupled to a gate of each said MOS transistor in a column of said EEPROM cells for activating said connection between said EEPROM cells and said input lines, and
- a programming input line coupled to a gate of each EEPROM transistor in said column of EEPROM cells for providing a programming input to said EEPROM transistors.

* * * * *